US008378701B2

(12) United States Patent  
West

(10) Patent No.: US 8,378,701 B2
(45) Date of Patent: Feb. 19, 2013

(54) NON-CONTACT DETERMINATION OF JOINT INTEGRITY BETWEEN A TSV DIE AND A PACKAGE SUBSTRATE

(75) Inventor: Jeffrey A. West, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 349 days.

(21) Appl. No.: 12/895,140

(22) Filed: Sep. 30, 2010

(65) Prior Publication Data

US 2012/0080595 A1  Apr. 5, 2012

(51) Int. Cl.
*G01R 31/305* (2006.01)

(52) U.S. Cl. ......... 324/754.22; 324/754.21; 324/754.23; 250/306; 438/17

(58) Field of Classification Search ............. 324/754.22, 324/754.21, 754.23, 762.02; 250/306, 310, 250/492.3; 438/17; 977/849
See application file for complete search history.

(56) References Cited

U.S. PATENT DOCUMENTS

| | | | |
|---|---|---|---|
| 6,232,787 B1 * | 5/2001 | Lo et al. .................. | 324/754.22 |
| 6,391,669 B1 | 5/2002 | Fasano | |
| 7,525,325 B1 | 4/2009 | Jenkins et al. | |
| 2004/0207414 A1 | 10/2004 | Verma et al. | |
| 2005/0214956 A1 | 9/2005 | Li et al. | |
| 2009/0278238 A1 | 11/2009 | Bonifield et al. | |
| 2011/0298488 A1 * | 12/2011 | Stillman et al. .......... | 324/762.02 |

* cited by examiner

*Primary Examiner* — David Gray
*Assistant Examiner* — Alexander J Nemtzow
(74) *Attorney, Agent, or Firm* — Steven A. Shaw; W. James Brady; Frederick J. Telecky, Jr.

(57) ABSTRACT

A non-contact voltage contrast (VC) method of determining TSV joint integrity after partial assembly. A TSV die is provided including TSVs that extend from a frontside of the TSV die to TSV tips on a bottomside of the TSV die. At least some TSVs (contacting TSVs) are attached to pads on a top surface of a multilayer (ML) package substrate. The ML package substrate is on a substrate carrier that blocks electrical access to the frontside of the TSV die. Two or more nets including groups of contacting TSVs are tied common within the ML substrate. A charged particle reference beam is directed to a selected TSV within a first net and a charged particle primary beam is then rastered across the TSVs in the first net. VC signals emitted are detected, and joint integrity for the contacting TSVs to pads of the ML package substrate is determined from the VC signals.

14 Claims, 2 Drawing Sheets

NON-CONTACT DETERMINATION OF JOINT INTEGRITY BETWEEN A TSV DIE AND A PACKAGE SUBSTRATE

FIELD

Disclosed embodiments relate to non-contact determination of joint integrity between integrated circuit (IC) die that include through substrate vias (TSVs) and a package substrate.

BACKGROUND

There are a variety of arrangements that incorporate a TSV die in a vertical stack to take advantage of the two (2)-sided connectivity provided by TSV die. For example, package-on-package (PoP) is one type of assembly flow that incorporates a TSV die in a vertical stack. Other examples include a PoP precursor, as well as some non-PoP packages, such as a package substrate on bottom, logic with TSV bonded to that, and a memory stack bonded to that, which may ship with no additional ball grid array (BGA)-containing package added after that.

For example, PoP is an IC packaging technique that allows vertical stacking of IC packages, such as a discrete logic BGA package and a memory BGA package. Two or more packages are installed on top of one another, i.e. vertically stacked, with a standard interface to route signals between them. This allows higher density, for example for mobile telephone/PDA market applications.

TSV-containing IC die such as microprocessor TSV die in a PoP flow are generally not yet in production. However, the assembly flow for a conventional PoP sequence for a wafer having a plurality of TSV die (a "TSV wafer") can be expected to be as follows:
1. Wafer probe ("multiprobe") the respective die on a thick TSV wafer (e.g., 600 to 800 µm thick) having embedded TSVs to identify good die on the basis of electrical tests. Electronic Inking where the die are tracked on stored wafer maps may be used for subsequent identification of "bad" die.
2. Attach the TSV wafer to a carrier wafer (typically silicon or glass).
3. Expose the embedded TSVs by thinning the bottom side of the TSV wafer (e.g. to about 30 to 100 µm) that may comprise protruding integral TSV tips that protrude <15 µm.
4. Add metal finish or contact pads coupled to exposed TSV tips.
5. Detach the carrier wafer.
6. Singulate the TSV wafer to provide a plurality of singulated "good" TSV die.
7. Die attach the good TSV die identified at wafer probe active circuit side down to a multi-layer (ML) package substrate that includes BGA pads on its bottom side that is typically attached to a substrate carrier (typically a silicon or glass carrier) to form a PoP precursor. The carrier provides rigidity. The active circuit side (i.e. frontside) of the TSV die is not electrically accessible via the package substrate due to the presence of the carrier.
8. Attach one or more die, such as a logic or memory die, on top of the TSV die to make contact with the metalized TSV tips or contact pads coupled to the TSV tips.

Steps 3, 4, and 7 in the above-described flow can result in electrical problems including TSV formation problems (e.g., missing TSVs), TSV contact problems (e.g., high resistance contacts to pads on the ML package substrate) or shorts (e.g., TSV shorts to ground) that can only be detected after connecting the top die to the exposed TSVs or to the contact pads coupled to the TSV tips because as noted above the carrier while present blocks electrical access to one side of the TSV die. The ML package substrate can also be the source of certain problems. Probing after die attach of the TSV die can be omitted. However, this will result in assembling some fraction of bad TSV die-substrate precursors during step 8 described above for attaching subsequent logic or memory die (e.g., where costly pre-packaged memory stacks may be added), that due to electrical problems such as those described above can result in failures at post-assembly testing.

There are no known practical solutions to test partially assembled TSV-die-on-substrate die stacks to evaluate joint integrity between the TSV die and the package substrate associated with the die attach process. Even if it were possible to contact probe the TSV die contacts to the ML package substrate using the protruding TSV tips from the bottomside of the TSV die for the topside contacts and some other contact pathway for contacting the bottomside contacts, standard contact probe techniques tend to damage the protruding (e.g. <15 µm) TSV tips, which can lead to an unreliable joint at the site of the damaged TSV tip following assembly of the top die to the TSV die. Such damage from contact probing of TSV tips can lower bond yield and/or reduce TSV joint reliability. What is needed is a non-contact method for determining TSV continuity through the TSV die and joint integrity between pillars or microbumps coupled to the TSVs on the TSV die to the underlying package substrate for partially assembled precursors.

SUMMARY

Disclosed embodiments describe non-contact voltage contrast (VC)-based methods of determining TSV continuity and joint integrity of the TSV die to a package substrate after partial assembly, where the package substrate is electrically floating. Such embodiments utilize at least one charged particle beam to generate secondary electron emissions. VC data from the secondary emissions is used to determine TSV joint integrity. The charged particle beam can comprise an electron beam, a proton beam or ion beam.

On the frontside of the TSV die at least a portion of the plurality of TSVs (referred to herein as "contacting TSVs") are attached to pads on a top surface of a ML package substrate. Such contacting TSVs are used to pass signals, voltage, or ground from the TSV die to the ML package substrate (e.g., to obtain access to later added BGA balls on the ML package substrate.) Some TSV on the TSV die may not be "contacting TSVs" as they are not connected to the ML package, for example, TSVs that only connect to a topside mounted device, such as to a memory IC on the TSV die, where no connection to the ML package substrate is needed. Disclosed embodiments interrogate the contacting TSVs, where groups of contacting TSVs are hook up electrically in parallel into common nets.

Contacting TSVs on the TSV die for each of the common nodes or "nets" (i.e., Vdd, Vss, and one or more signal nodes) are tied together within one or more metal levels provided by a ML package substrate. A reference charged particle beam is directed to a selected TSV in one of the nets (e.g., the first net). A primary charged particle beam is then rastered (i.e. scanned) across an area that includes the first net to obtain VC signals. The VC signals are detected, and joint integrity for the contacting TSVs to the pads on the ML package substrate is determined. The determining of joint integrity can comprise comparing the VC signals received to VC signals from a known good reference, such as a known good die (KGD) for the particular TSV die being measured.

In one disclosed embodiment, at least a portion of the time the primary charged particle beam is rastered the charge particle reference beam is also applied. In another embodiment, such as when the bleed rate of charge from the charged net is slow, there can be no time overlap for the respective particle beams, which enables use of a VC system having a single charged particle beam source.

DETAILED DESCRIPTION

Figure 1:
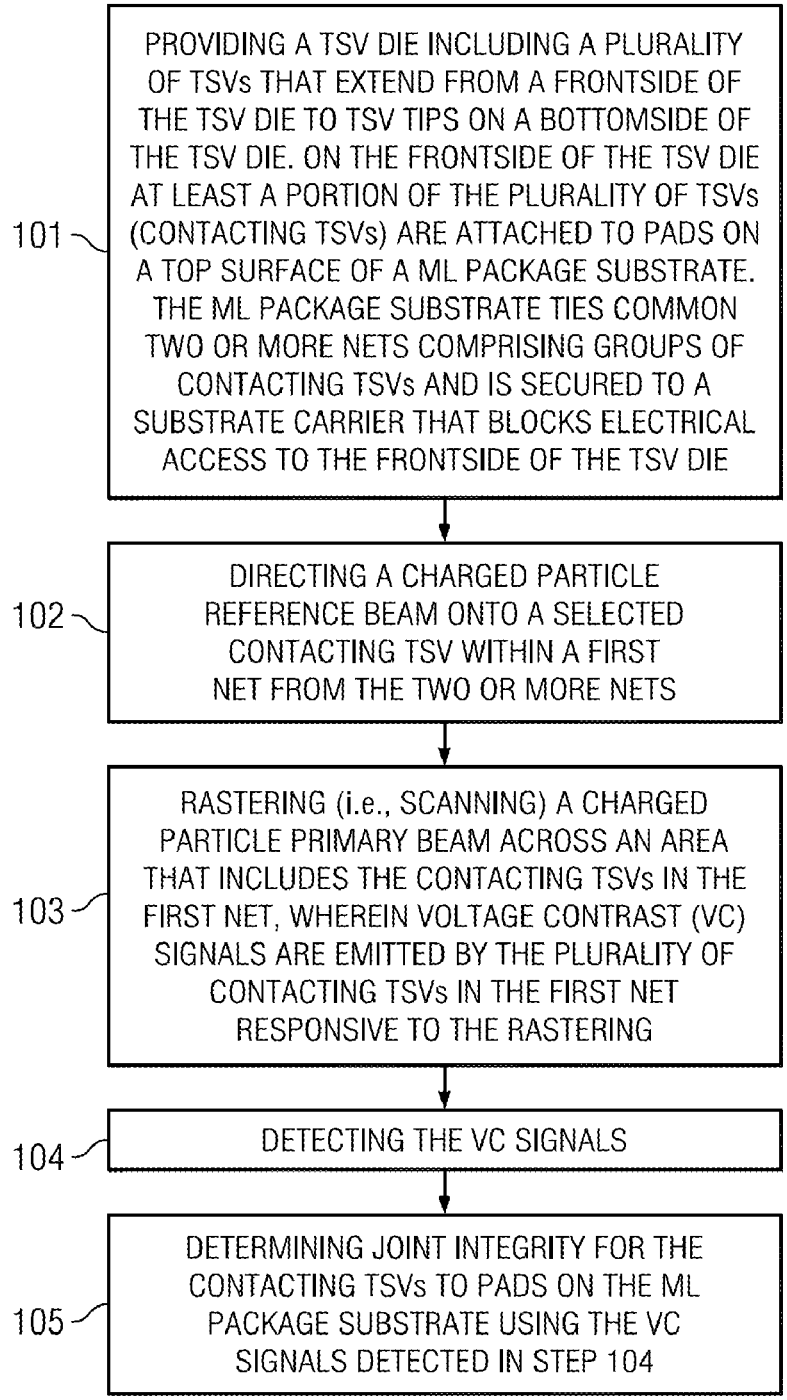
FIG. 1 is a flow chart that shows steps in an exemplary non-contact VC-based method for determining TSV continuity and joint integrity to a package substrate after partial assembly, according to a disclosed embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Disclosed embodiments utilize a new VC technique to detect TSV continuity and TSV joint integrity to a ML package substrate after partial assembly. In conventional VC for IC inspection, a scanning electron microscope (SEM) is used to direct a beam of electrons onto the IC which is located on a stage in a vacuum chamber, with a semiconductor substrate on which the IC is formed is electrically grounded. The beam of electrons incident on the IC produces secondary electron emission which is detected by a detector that generates an image of the IC. The amount of secondary electrons generated by the IC depends upon local electric fields in and near the surface of the IC, with the electric fields, in turn, depending upon the presence or absence of electrically conducting paths between circuit elements of the IC and the electrically-grounded substrate. Variations in the local electric fields (termed VC) result in variations in image contrast and are responsible for certain areas of the IC appearing relatively bright (i.e. light) in an image when there is a conductive path to the grounded substrate, or relatively dark in the absence of any conductive path to the grounded substrate. Conventional VC methods thus cannot be performed on electrically-floating ICs or electronic device stacks, such partially assembled PoPs comprising a TSV die/ML package substrate/substrate carrier stack.

Disclosed embodiments utilize a variant of VC to detect TSV continuity and TSV joint integrity to a ML package substrate after partial assembly, despite the ML package substrate electrically floating. FIG. 1 is a flow chart that shows steps in an exemplary non-contact VC-based method 100 for determining TSV continuity and joint integrity to a ML package substrate after partial assembly, according to a disclosed embodiment. Step 101 comprises providing a TSV die including a plurality of TSVs that extend from a frontside of the TSV die (generally coupled to a BEOL metal layer (e.g., M1, M2, etc.) or the contact layer to TSV tips on a bottomside of the TSV die. On the frontside of the TSV die at least a portion of the plurality of TSVs (contacting TSVs) are attached to pads on a top surface of a ML package substrate. The attachments can be conventional flip chip, micro-bump, or Cu pillar attachments.

The Inventor has recognized that having contacting TSVs tied common in the ML substrate will result in the brightness of their secondary electron emission responsive to irradiation by a charged particle beam being essentially equal for all TSVs within the net, provided all joints between the contacting TSVs and the ML package substrate are low resistance ("good") joints. Furthermore, the Inventor has recognized that the presence of any high resistance or open ("bad") joints between the contacting TSVs and the ML package substrate will produce a distinguishable relative brightness level in the VC signal as compared to the VC signals from low resistance joints between the contacting TSVs and the ML package substrate, thus making it relatively easy to identify contacting TSVs that are connected to abnormal, highly resistive TSV to package substrate joints.

As used herein, "TSV tips" include either directly contactable TSV tips (e.g., protruding TSV tips) or indirectly contactable tips. An example of indirect tips is when pads on the TSV die are coupled to the TSV tips, such as by a redirect layer (RDL).

In typical embodiments, only a portion of the plurality of TSVs are contacting TSVs, which as defined above are those TSVs that are connected to the ML package substrate, such as for passing signals, voltage, or ground from the TSV die to the ML package substrate. Non-contacting TSVs are not connected to the ML package substrate.

The ML package substrate is secured to (e.g., glued to) a substrate carrier, such as a quartz (silica) or ceramic carrier, that blocks electrical access to the frontside of the TSV die. The ML substrate comprises a plurality of embedded metal interconnect levels for routing, and typically includes at least four (4) embedded metal levels. Two or more nets comprising groups of contacting TSVs are tied common within the ML substrate by one or more of the embedded metal levels. The ML package substrate can comprise an organic substrate or a ceramic substrate. The ML package substrate can comprise a singulated substrate or a substrate panel comprising a plurality of physically connected ML package substrates.

Step 102 comprises directing a charged particle reference beam onto a selected contacting TSV within a first net from the two or more nets. The charged particle reference beam can comprise an electron beam, a proton beam, or an ion beam. The reference beam can be either a continuous beam or a pulsed beam. To avoid radiation damage to the TSV die, the accelerating voltage is generally $\leq 1$ kV, so that in the case of an electron or proton beam the beam energy is $\leq 1$ keV.

Step 103 comprises rastering (i.e., scanning) a charged particle primary beam across an area described herein as a region of interest (ROI) that includes at least the first net. Responsive to the rastering enhanced VC signals (e.g., secondary electrons or ions) are emitted from the plurality of contacting TSVs within the first net responsive to the rastering, with the VC signal enhancement for TSVs in the first net being due to the pre-charging provided by the charged particle reference beam (step 102). The charged particle reference beam may be applied during at least a portion of the time for rastering, and in one embodiment is applied continually through the rastering. However, in one embodiment the time overlap of the reference beam (step 102) and primary beam (step 103) is not needed. The energy or current of the charged particle reference beam is typically at a level that is at least 10% higher as compared to an energy or current of the charged particle primary beam.

The combination of the reference beam in step 102 and the rastered primary beam in step 103 has been found by the Inventor to enhance the contrast in the VC signal emitted in step 103 responsive to the primary beam. Thus, fixing a charged particle beam at the selected contacting TSV tied common to the first net creates a net charge on this group of contacting TSVs in the first net that is much higher than the than the charge accumulated on the rest of the TSVs in the area that is rastered that are being charged up only by the rastering charge particle primary beam. This technique may be contrasted with conventional VC methodologies that use a single rastering beam to provide both the charging and the VC signal emission. The disclosed use of a reference beam for precharging coupled with a primary beam that is rastered creates a significantly improved signal-to-noise ratio and higher contrast as compared to conventional VC methodologies.

Step 104 comprises detecting the VC signals emitted from the ROI. Bad ML package substrate-TSV tip joints will provide VC signals having measurably different contrast level than the rest of the TSVs in the net precharged by the reference beam that have "good" (i.e. low resistance) connections to pads on the ML substrate.

Step 105 comprises determining TSV joint integrity for the contacting TSVs to the ML package substrate. One determination method comprises comparing the VC signals detected with VC signals from a neighboring die to look for differences. An alternate method stores image data from a known good die (KGD), and categorizes which TSVs are bright and which are considered dark, and has an image processor assign bright or dark to each TSV within the imaged array and compares with the saved KGD reference.

The TSVs in each of the respective nets are generally located in various positions within a large TSV array on the TSV die. Accordingly, it may not be practical to create a rastering pattern that only rasters across the TSVs in the first net. Rastering is typically performed over a large rectangular zone encompassing some defined ROI.

It is generally sufficient to sample contacting TSVs in one of the nets on the TSV die to enable a determination of TSV to ML package substrate joint integrity overall. Such a sampling plan is analogous to most yield enhancement (YE) inspections that evolve to a sampling plan. However, if it is desired to characterize TSV joint integrity for all nets on the TSV die, steps 102-104 can be repeated by pointing the reference beam at a selected TSV in another net (e.g., second net), rastering across a ROI including the TSVs in the second net and detecting VC signals from the TSVs in the second net, etc.

As noted above, in one embodiment there is no time overlap between application of the reference beam (step 102) and the primary beam (step 103). Since the disclosed methodology is applied to a TSVs that are all electrically floating, in this embodiment the TSVs in a selected net may be precharged by the reference beam, and because the floating condition described above can hold the charging provided the bleed rate of charge from the net is slow, rastering can follow pre-charging to obtain a similar effect to that accomplished with the reference beam being applied during at least a portion of the time the primary raster beam is applied. Thus, in this alternate embodiment, only one charged particle beam is used at any given time, and the VC system thus only needs a single charge particle beam source.

Figure 2:
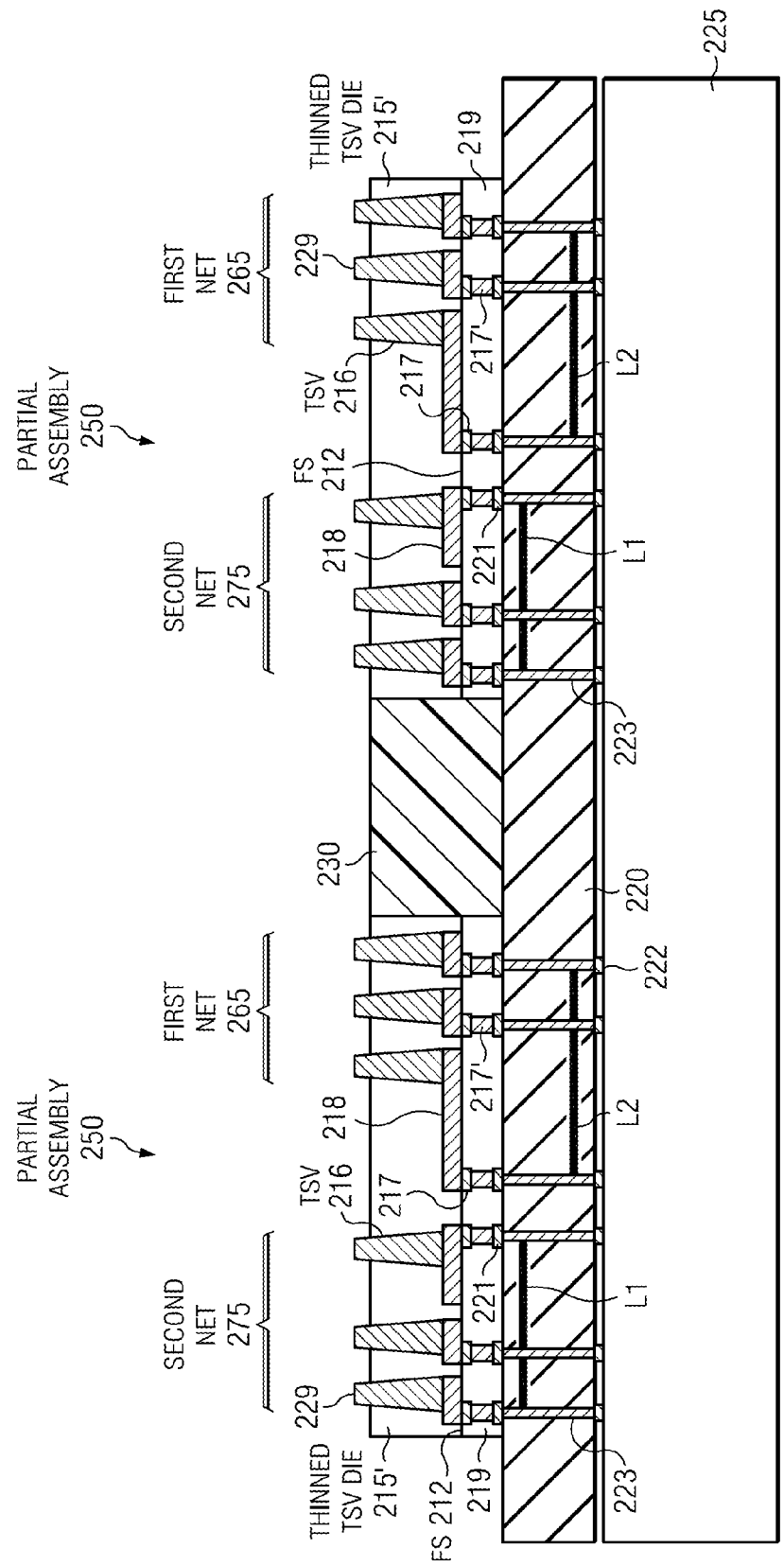
FIG. 2 is a cross sectional depiction of a partial electronic assembly comprising a thinned TSV die attached to a ML package substrate that is secured to a substrate carrier for which disclosed VC embodiments may be practiced to detect TSV continuity and joint integrity to a ML package substrate, according to a disclosed embodiment.

FIG. 2 is a cross sectional depiction of a partial electronic assembly 250 comprising a thinned TSV die 215' (e.g., 25 to 100 µm) attached to a ML package substrate 220 that is secured to a dielectric substrate carrier 225 for which disclosed VC embodiments may be practiced to detect TSV continuity and TSV die to ML package substrate joint integrity, according to a disclosed embodiment. Partial electronic assembly 250 is the resulting structure following the flip chip die attach of a singulated TSV die comprising a frontside (FS) 212 having active circuitry to a ML package substrate 220 that is disposed on a substrate carrier 225 that blocks electrical access to the frontside of 212 of the TSV die 215', followed by backgrinding or other removal processing to expose TSV tips to form the protruding TSV tips 229 shown in FIG. 2, or more generally to form contactable TSV tips. In another embodiment the TSV tips are already exposed at the time of TSV die singulation.

Tip exposure processing can comprise backgrinding, chemical mechanical polishing (CMP) and/or chemical etch, typically done prior to TSV die singulation. The thickness of the TSV die 215' is generally <200 µm after TSV exposure, generally being 25 to 100 µm thick. The protruding TSV tips 229 which typically protrude a distance of 3 to 15 µm from the bottomside of the thinned TSV die 215' and provide the structure for bonding at least one die (e.g., a memory die) on top of the respective partial electronic assemblies 250. Although not shown, the exposed TSV tips 229 can be flush (non-protruding) or recessed (i.e., nearly flush), and coupled to by contacting pads that are over the TSV tips or laterally positioned pads (e.g. by a RDL).

The frontside 212 of the TSVs 216 are shown coupled to pillar pads 217 and pillars 217' (e.g., copper pillars) via a BEOL metal layer 218, where the pillars 217' are coupled to topside substrate pads 221 of the ML package substrate 220. The pillars 217' can be replaced by studs (e.g., gold studs) or bumps.

The ML package substrate 220 also includes BGA substrate pads 222 and vertical paths 223 that couple the embedded topside substrate pads 221 to the BGA substrate pads 222. Although shown as direct vertical paths 223 through ML package substrate 220, the through paths can be indirect paths as well provided coupling is provided between the topside substrate pads 221 and the BGA substrate pads 222.

The respective TSVs 216 for each of the thinned TSV dies 215' shown are tied common within respective embedded metal levels L1 and L2 of ML package substrate 220 into a second net 275 and a first net 265, respectively. Underfill 219, such as organic underfill, is lateral to the pillars 217' for filling the volume between the TSV die 215' and the ML package substrate 220 between the pillar joints to ML package substrate 220. Optional mold compound 230 is shown between the TSV die 215' for adding rigidity.

Disclosed embodiments can generally be applied to any arrangement that incorporates a TSV die as the topside device in a vertical stack. Examples include PoPs, PoP precursors, as well non-PoP packages, such as a ML package substrate on the bottom, a logic die with TSVs bonded to that, and a memory stack bonded to the logic die.

The active circuitry formed on the wafer semiconductor substrate comprises circuit elements that may generally include transistors, diodes, capacitors, and resistors, as well as signal lines and other electrical conductors that interconnect the various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

I claim:

1. A non-contact voltage contrast (VC) method of determining TSV joint integrity after partial assembly, comprising:
providing a through silicon via (TSV) die including a plurality of TSVs that extend from a frontside of said TSV die to TSV tips on a bottomside of said TSV die, wherein on said frontside of said TSV die at least a portion of said plurality of TSVs (contacting TSVs) are attached to pads on a top surface of a multilayer (ML) package substrate, said ML package substrate being on a substrate carrier that blocks electrical access to said frontside of said TSV die, wherein two or more nets comprising groups of said contacting TSVs are tied common within said ML substrate;
directing a charged particle reference beam onto a selected TSV within a first net selected from said two or more nets;
rastering a charged particle primary beam across an area that includes at least said contacting TSVs of said first net, wherein VC signals are emitted responsive to said rastering;
detecting said VC signals, and
determining joint integrity for said contacting TSVs to said pads of said ML package substrate using said VC signals.

2. The method of claim 1, wherein said determining comprises comparing a pattern from said VC signals to a pattern obtained from VC signals obtained from a known good die (KGD) reference for said TSV die.

3. The method of claim 1, wherein said charged particle reference beam and said charged particle primary beam comprises an electron beam, a proton beam, or an ion beam.

4. The method of claim 1, wherein said TSV tips comprise protruding TSV tips.

5. The method of claim 1, wherein said substrate carrier comprises a quartz or a ceramic carrier.

6. The method of claim 1, further comprising forming an image from said VC signals and wherein said determining joint integrity comprises utilizing said image.

7. The method of claim 1, further comprising:
directing said charged particle reference beam onto a selected TSV within a second net selected from said two or more nets;
rastering a charged particle primary beam across an area including said contacting TSVs of said second net;
detecting said VC signals from said rastering said charged particle primary beam across said contacting TSVs of said second net.

8. A non-contact voltage contrast (VC) method of determining TSV joint integrity after partial assembly, comprising:
providing a through silicon via (TSV) die including a plurality of TSVs that extend from a frontside of said TSV die to TSV tips on a bottomside of said TSV die, wherein on said frontside of said TSV die at least a portion of said plurality of TSVs (contacting TSVs) are attached to pads on a top surface of a multilayer (ML) package substrate, said ML package substrate being on a substrate carrier that blocks electrical access to said frontside of said TSV die, wherein two or more nets comprising groups of said contacting TSVs are tied common within said ML substrate;
directing a charged particle reference beam onto a selected TSV within a first net selected from said two or more nets;
rastering a charged particle primary beam across an area that includes at least said contacting TSVs of said first net, wherein VC signals are emitted responsive to said rastering;
detecting said VC signals, and
determining joint integrity for said contacting TSVs to said pads of said ML package substrate using said VC signals,
wherein said charged particle reference beam and said charged particle primary beam are separate beams, and wherein said charged particle reference beam is applied to said selected TSV during at least a portion of a time said rastering of said charged particle primary beam takes place.

9. The method of claim 8, wherein said charged particle reference beam and said charged particle primary beam both comprise an electron beam.

10. The method of claim 8, wherein an energy or current of said charged particle reference beam is at a level that is at least 10% higher as compared to an energy or current of said charged particle primary beam.

11. The method of claim 8, wherein said TSV tips comprise protruding TSV tips.

12. The method of claim 8, wherein said substrate carrier comprises a quartz or a ceramic carrier.

13. The method of claim 8, further comprising forming an image from said VC signals and wherein said determining joint integrity comprises utilizing said image.

14. The method of claim 8, further comprising:
directing said charged particle reference beam onto a selected TSV within a second net selected from said two or more nets;
rastering a charged particle primary beam across an area including said contacting TSVs of said second net, and
detecting said VC signals from said rastering said charged particle primary beam across said contacting TSVs of said second net.

* * * * *